United States Patent
Zangmeister et al.

(10) Patent No.: US 6,828,581 B2
(45) Date of Patent: Dec. 7, 2004

(54) SELECTIVE ELECTROLESS ATTACHMENT OF CONTACTS TO ELECTROCHEMICALLY-ACTIVE MOLECULES

(75) Inventors: Christopher D. Zangmeister, Gaithersburg, MD (US); Roger D. Van Zee, Takoma Park, MD (US)

(73) Assignee: The United States of America as represented by the Secretary of Commerce, Washington, DC (US)

(*) Notice: Subject to any disclaimer, the term of this patent is extended or adjusted under 35 U.S.C. 154(b) by 0 days.

(21) Appl. No.: 10/246,148

(22) Filed: Sep. 17, 2002

(65) Prior Publication Data

US 2003/0162316 A1 Aug. 28, 2003

Related U.S. Application Data

(60) Provisional application No. 60/359,623, filed on Feb. 26, 2002.

(51) Int. Cl.$^7$ ................................................ H01L 35/24
(52) U.S. Cl. ........................ 257/40; 257/9; 257/14; 257/49; 257/288
(58) Field of Search ..................... 257/40, 9, 14, 257/49, 288

(56) References Cited

U.S. PATENT DOCUMENTS

| | | | |
|---|---|---|---|
| 5,985,705 A | 11/1999 | Seliskar | 438/197 |
| 6,048,623 A | 4/2000 | Everhart et al. | 428/464 |
| 6,166,439 A | * 12/2000 | Cox | |
| 6,320,200 B1 | 11/2001 | Reed et al. | 257/40 |
| 6,348,700 B1 | 2/2002 | Ellenbogen et al. | 257/40 |

OTHER PUBLICATIONS

Moore, G.E., "Cramming more components into integrated circuits," *Electronics*, vol. 38, 1965, pp. 114–117.
Goldie, W., "Metallic coating of plastics," *Electrochemical Publications Limited*, Middlesex, England, 1968.
Wells, M., Dermody, D.L., Yang, H.C., Kim, T., Crooks, R.M., Ricco, A.J., "Interactions between organized,surface–confined monolayers and vapor–phase probe molecules," *Langmuir*, vol. 12, 1996.
McDermott, J., "Plating of plastics with metal," *Noyes Data Corp.*, Park Ridge, N.J., 1974.
Jung, D.R., Czanderna, A.W., Herdt, G.C., "Interactions and penetration at metal/self–assembled organic monolayer interfaces," *J. Vac.Sci. Technol. A* 14(3), May/Jun. 1996.

(List continued on next page.)

Primary Examiner—Long Pham
(74) Attorney, Agent, or Firm—Cochran Freund & Young LLC (57) ABSTRACT

A solution-based method for attaching metal contacts to molecular films is described. The metal contacts are attached to functional groups on individual molecules in the molecular film. The chemical state of the functional group is controlled to induce electroless metal deposition preferentially at the functional group site. The functionalized molecules may also be patterned on a surface to give spatial control over the location of the metal contacts in a more complex structure. Spatial control is limited only by the ability to pattern the molecular film. To demonstrate the feasibility of this concept, self-assembled monolayers of model, molecular-electronic compounds have been prepared on gold surfaces, and these surfaces were subsequently exposed to electroless deposition plating baths. These samples exhibited selective metal contact attachment, even on patterned surfaces.

2 Claims, 9 Drawing Sheets

OTHER PUBLICATIONS

Herdt, G.C., Cazanderna, A.W., "Metal overlayers on organic functional groups of self organized molecular assemblies:VII. Ion scattering spectroscopy and x–ray photoelectron spectroscopy of Cu/CH3 and Cu/OOOCH3," *J. Vac. Sci. Technol. A, 15(3)*, May/Jun. 1997.

Zhou, C., Deshpande, M.R., Reed, M.A., "Nanoscale metal/ self–assembled monolayer/metal heterostructures," *Appl. Phys. Lett.*, vol. 71, Aug. 4, 1997.

Xia, Y., Whitesides, G.M., "Soft Lithography," *Agnew Chem. Int. Ed.*, vol. 37, 1998, pp. 550–575.

Reed, M.A., *Proc., IEEE*, vol. 87, p. 652, 1999.

Herdt, G.C., Czanderna, A.W., "Metal layers on organic functional groups of self–assembled monolayers:VIII. X–ray photoelectron spectroscopy of the Ni/COOH interface," *J, Vac. Sci. Technol. A. 17(6)*, Nov./Dec. 1999.

* cited by examiner

SELECTIVE ELECTROLESS ATTACHMENT OF CONTACTS TO ELECTROCHEMICALLY-ACTIVE MOLECULES

CROSS REFERENCE TO RELATED APPLICATIONS

This application is based upon and claims the benefit of U.S. provisional application No. 60/359,623, entitled "SELECTIVE ELECTROLESS ATTACHMENT OF CONTACTS TO ELECTROCHEMICALLY-ACTIVE MOLECULES", filed Feb. 26, 2002, the entire disclosure of which is herein specifically incorporated by reference for all that it discloses and teaches.

BACKGROUND OF THE INVENTION

1. Field of the Invention

The present invention generally pertains to molecular electronics and more specifically to the formation of metal contacts connected to molecules and molecular films.

2. Description of the Background

Nearly all modern electronic devices are based on the complementary metal-oxide-silicon field-effect transistors (CMOS-FET). Manufacturing improvements of solid-state devices, such as the CMOS-FET, have nearly doubled computing powers every eighteen months for the past thirty years. These improvements are a direct result of the miniaturization of devices used in computer processors. Unfortunately, CMOS technology is beginning to show limits associated with the fundamental physical laws governing device performance and technical problems associated with manufacturing. Thus, alternative technologies are being sought which are unlike FET devices that operate based upon the movement of electrons in bulk material. These new technologies operate in the realm of quantum mechanical phenomena that emerge and dictate electron dynamics at the nanometer ($10^{-9}$ m) scale.

A specific area that has shown considerable promise in the miniaturization of computer processor devices is a component technology that uses individual molecules or arrays of molecules, that is termed molecular electronics. This relatively new approach exploits the fact that molecules are naturally occurring nanometric structures. By devising molecular structures to act as electrical switches, then by combining these switches into complex circuit structures, computational nanocircuitry can be achieved. In this manner, conductive electrodes are attached to a molecule within a layer of molecules, and thus the layer may perform functions in an analogous fashion to a solid-state device. The application of molecular electronics greatly reduces the scale of individual devices to nanometers per device; therefore, more than a billion devices may be contained per square centimeter.

A typical molecular electronic device is composed of two or more contacts (sometimes called gates or terminals) and a molecular film or a molecule that is attached to these contacts. The fabrication procedure involves forming a molecular film (MF), which can be as thin as one molecular layer, on one contact. Additional contacts are then attached to the molecule. These devices function by modulating electron flow between the contacts through the MF. The flow of current through the molecule and performance of the device are specifically dependent upon the chemical and molecular structure of the molecule and the strength of the interaction between the molecular layer and each of the contacts. In most cases, the first contact formed in these devices is a covalent chemical bond formed in solution. The second contact must be formed on top of the MF.

In order for the molecular electronic device to function properly, each of the contacts must be electrically isolated from one another. Achieving this isolation is complicated by the length scale between contacts, which is defined by the length of the molecule (1 nm–5 nm). To ensure electrical isolation, and long-term performance of the device, a strong interaction between the metal contacts and the MF is required. Additionally, this strong interaction between the molecule and the contacts eliminates some unwanted device characteristics (e.g. device shorting).

Presently, metal contacts in molecular electronic devices are formed by evaporating a metal layer to the surface-bound MFs. This technique is performed within a vacuum chamber and is called vapor deposition. The interaction between the evaporated metal layer and the molecule is highly dependent on the metal and the chemical composition of the MF. This interaction between the metal and a MF may be changed through the introduction of a functional group to the molecular structure. For example, amine or carboxylic acid functional groups decrease the extent of metal penetration through a MF when metal contacts are grown on top of the monolayer by evaporation that can cause degradation or shorting of the electrical contacts.

SUMMARY OF THE INVENTION

The present invention overcomes the disadvantages and limitations of the prior art by providing a method for attaching metal contacts to individual molecules and/or aggregates of molecules that form a molecular film by using electroless deposition (ELD) to form a metal contact on a MF. ELD is a solution-based technique where a metal is catalytically reduced at a surface.

The present invention may therefore comprise a method of attaching metal contacts to functional groups on individual molecules in a molecular film to facilitate their function as solid-state devices comprising: attaching a functional molecular group to selective portions of a metallic plate to form patterned areas of self-assembled monolayers on a conductive bottom contact, patterning the functionalized molecules on a surface to give spatial control over the location of the metal contacts, placing the patterned surfaces of the self-assembled monolayers into an electroless plating bath for selective metal deposition onto the surfaces, controlling the chemical state of the functional molecular group by preferentially inducing the electroless metal deposition at the functional molecular group site, attaching metal contacts to the patterned portions of the self-assembled monolayers to form a top contact by depositing a metallic layer on the non-metallic surfaces of the self-assembled monolayers with an electroless plating bath consisting of water, formaldehyde, copper sulfate, sodium hydrogen tartrate, adjusting the pH of the electroless plating bath to approximately 12.8 using sodium hydroxide, removing the self-assembled monolayers from the electroless plating bath after a prescribed length of time and rinsing the self-assembled monolayers with water.

The present invention may also comprise a solid-state device made by the process comprising: attaching a functional molecular group to a selective portions of a metallic plate to form patterned areas of self-assembled monolayers on a conductive bottom contact, patterning the functionalized molecules on a surface to give spatial control over the location of the metal contacts, placing the patterned surfaces of the self-assembled monolayers into an electroless plating bath for selective metal deposition onto the surfaces, controlling the chemical state of the functional molecular group by preferentially inducing the electroless metal deposition at the functional molecular group site, attaching metal contacts to the patterned portions of the self-assembled monolayers to form a top contact by depositing a metallic layer on the non-metallic surfaces of the self-assembled monolayers with an electroless plating bath consisting of water, formaldehyde, copper sulfate, sodium hydrogen tartrate, adjusting the pH of the electroless plating bath to approximately 12.8 using sodium hydroxide, removing the self-assembled monolayers from the electroless plating bath after a prescribed length of time and rinsing the self-assembled monolayers with water.

The disclosed embodiments have numerous advantages over prior art. These include the elimination of additional process steps required to make the MF compatible with a vacuum environment and greater control over the chemical state of the MF. With the present embodiment, the chemical state of the MF can be readily varied in solution by changing variables such as pH and ionic strength. The increased control gained by producing the MF in solution greatly increases the type of physiochemical interactions that may be formed between the metal contact and the molecular layer. Additionally, ELD offers spatial control and precision at the required device densities necessary in molecular electronic applications. These advantages make the present embodiment suitable for applications in a variety of areas including, but not limited to, molecular electronics, electrical contacts, metal patterning and electroless deposition.

Numerous advantages and features of the disclosed embodiments will become readily apparent from the following detailed description of the invention and the embodiment thereof, from the claims and from the accompanying drawings in which details of the invention are fully and completely disclosed as a part of this specification.

DETAILED DESCRIPTION OF THE INVENTION

The present embodiment details a method for attaching metal contacts to individual molecules and/or aggregates of molecules that form a molecular film by using ELD to form a metal contact on a MF. These molecules contain a functional group, in one embodiment, carboxylic acid (—COOH), tailored to selectively attach a contact to the molecule or molecular film at the site of the functional group. This contact is attached by growing a metal particle using ELD. ELD is an autocatalytic process where metal ions in solution are reduced at a surface in the absence of an externally applied electric field through surface mediated redox reactions. The deposition of metal at a surface is dependent upon, and fundamentally controlled by, the interaction of metal ions and subsequent reduction. In the case of organically modified surfaces (e.g. self-assembled monolayers), this interaction is often insufficient to initiate ELD. To offset this limitation, these surfaces are frequently exposed to various metal ions or colloids that catalytically activate the surface to ELD. The functionalized molecules may also be patterned to give spatial control over the location of the metal contacts in a more complex structure. The physical dimensions of the areas deposited and the deposition conditions may be altered by controlling such variables as pH and the ionic strength of the solution to control the physical dimensions and degree of interaction between the MF and the contact. For example, the extent of interaction can be highly varied by changing the functional group of the molecule.

Figure 1:
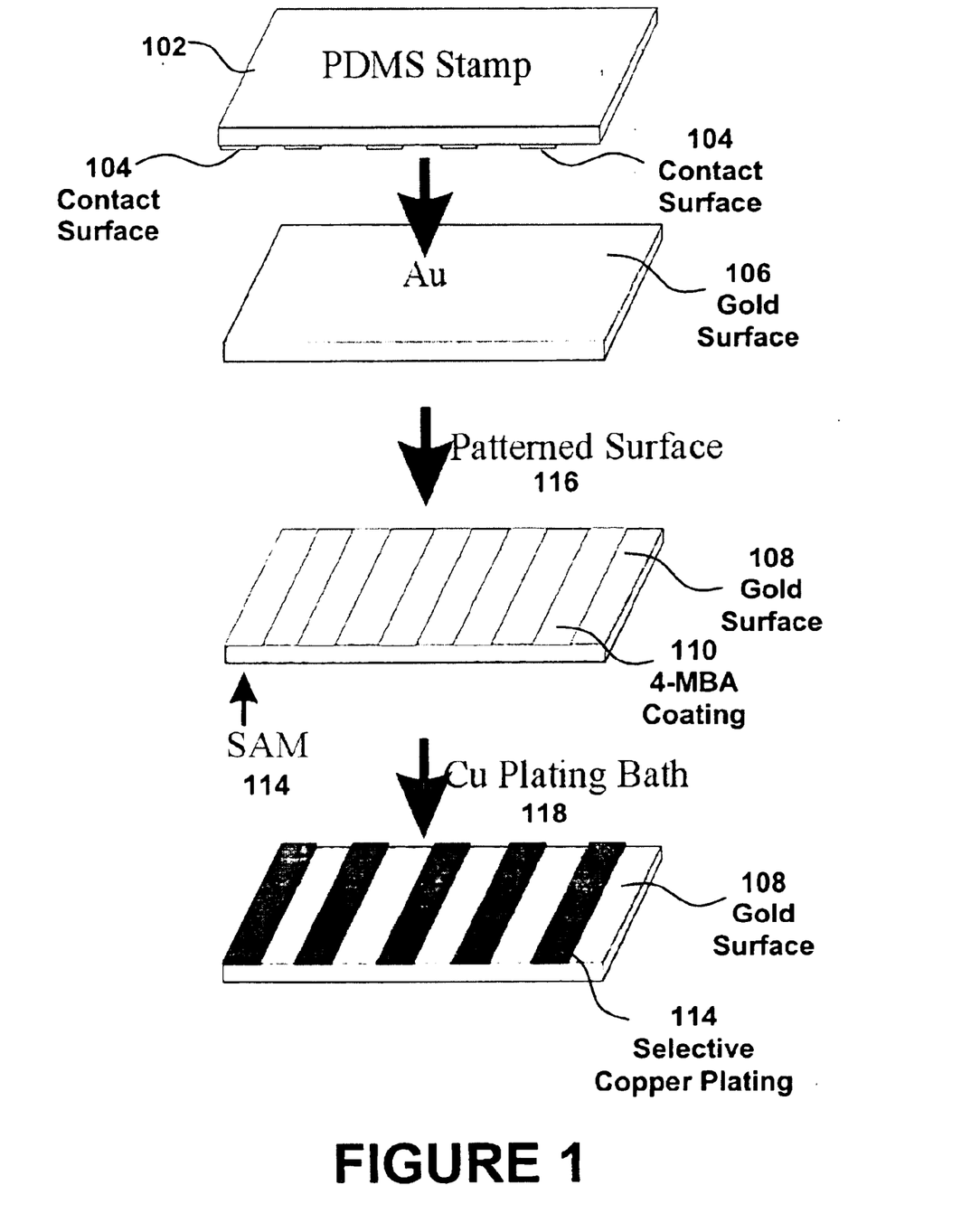
FIG. 1 is a schematic illustration of the process of selective electroless deposition on self-assembled monolayers.

FIG. 1 is a schematic detailing the overall system of preparing a patterned self-assemble monolayer 114 (SAM), and subsequently selectively depositing metal on the surface of the SAM surface. The interaction between the deposited metal and a MF may be changed through the introduction of a functional group to the molecular structure. For example, amine or carboxylic acid functional groups decrease the extent of metal penetration through a MF when metal contacts are grown on top of the monolayer by evaporation. As shown in FIG. 1, a poly dimethylsiloxane (PDMS) stamp 102 is used to place 4-MBA onto a metallic (Au) surface 106. The contact surface of the stamp 104 contains a preselected geometry to selectively coat a portion of the metal surface 106 thereby forming a SAM 114 with alternating strips of 4-MBA 110 and gold 108. The SAM containing a patterned surface of 4-MBA 116 is then place in an ELD 118 plating bath where copper $Cu^{2+}$ ions are selectively deposited on the areas of the SAM that have been coated with 4-MBA 114. The result is a selective electroless attachment of metal contacts to an electrochemically-active molecule.

FIG. 1 further demonstrates the advantages ELD offers over vacuum evaporation of contacts. Since ELD allows the chemical state of a functional molecular group to be varied through the manipulation of solution conditions, the extent of interaction between the functional group in a MF and the contact can be customized. Additionally, by combining patterning of MFs with ELD, as shown in FIG. 1, metal may be deposited at pre-selected sites 114. Furthermore, the rate of deposition and grain size of the metal deposition can be controlled by environmental conditions (parameters such as solution type, plating time, and bath temperature, etc.) and by manipulating these deposition conditions, it is possible to grow contacts with specific physical characteristics.

By preparing molecular films in a solution-based environment as exemplified in FIG. 1, additional advantages of ELD over evaporation techniques are realized. After formation of the film, no additional process steps are required to make the MF (including the platform on which it was grown) compatible with a vacuum environment. This time-consuming process slows production and increases the cost of molecular electronic devices. By plating the molecular film in solution as shown, the chemical state of a MF can readily and easily be controlled by changing variables such as pH and ionic strength. The lack of control found within the vacuum environment greatly limits the type of physio-chemical interactions that may be formed between the metal contact and the molecular layer. ELD also offers spatial control at the device densities required in molecular electronic applications. Whereas additional process steps may be introduced to assist in overcoming these spatial control issues where evaporation techniques are utilized, the steps will often alter the MF itself and take additional time and materials which increase manufacturing cost.

Figure 2:
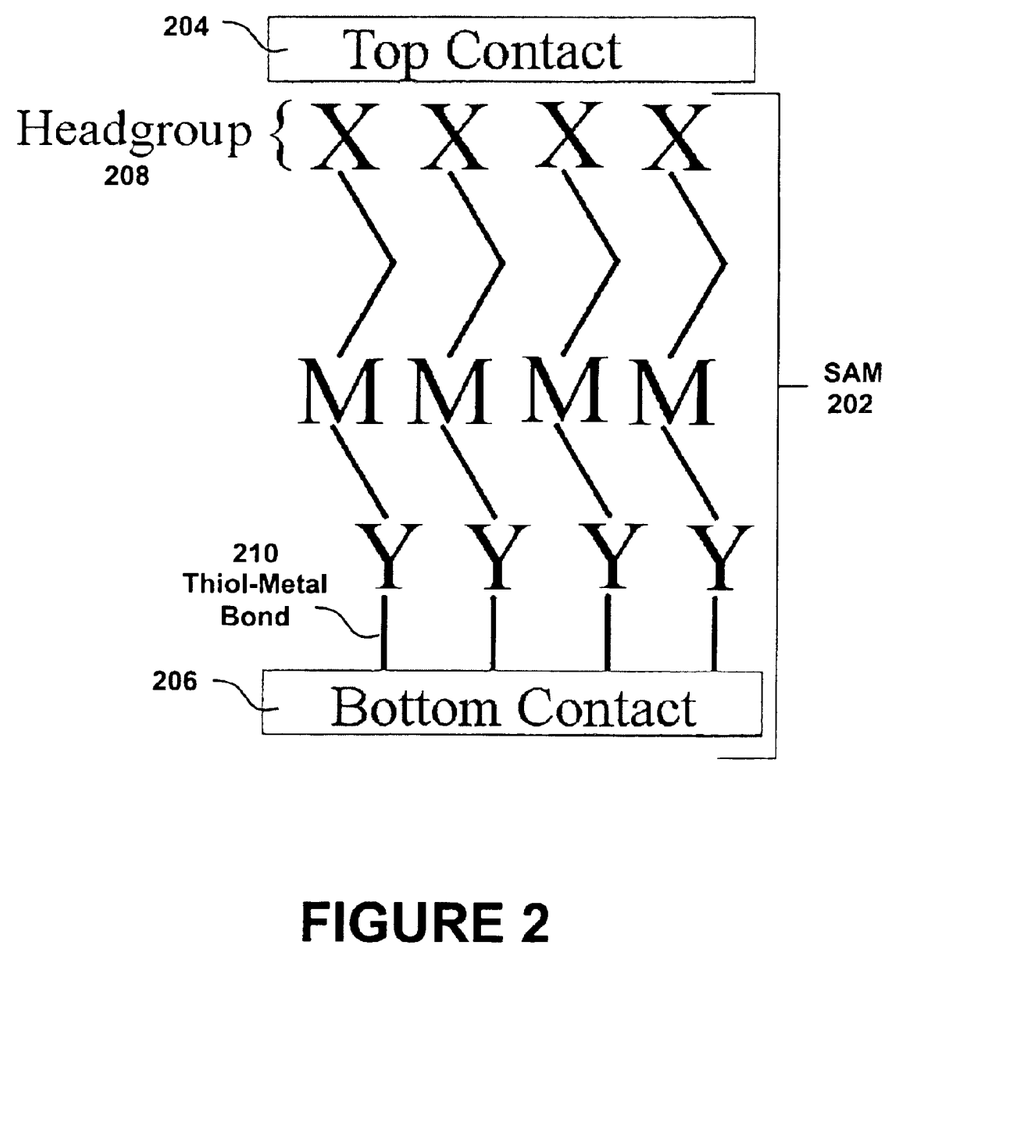
FIG. 2 is a schematic illustration of a self-assembled monolayer with a top contact.

FIG. 2 of the drawings discloses a more detailed schematic illustration of a self-assembled monolayer such as described in FIG. 1. As shown in FIG. 2, the self-assembled monolayers 202 of a model molecular electronic compound have been prepared on a metallic plate shown as the bottom contact 206. In this generalized example, the SAM constituted the molecular film (X-M-Y) bound by the Y to the metallic surface with a thiol-metal bond 210. By subsequently exposing the SAM to an ELD plating bath, metal is deposited only over regions where the SAM was patterned on the metallic surface to form a top contact 204. The bonding of the top contact to the SAM 202 is accomplished through the interaction of the top contact 204 with the headgroup 208 of the SAM 202.

Figure 3:
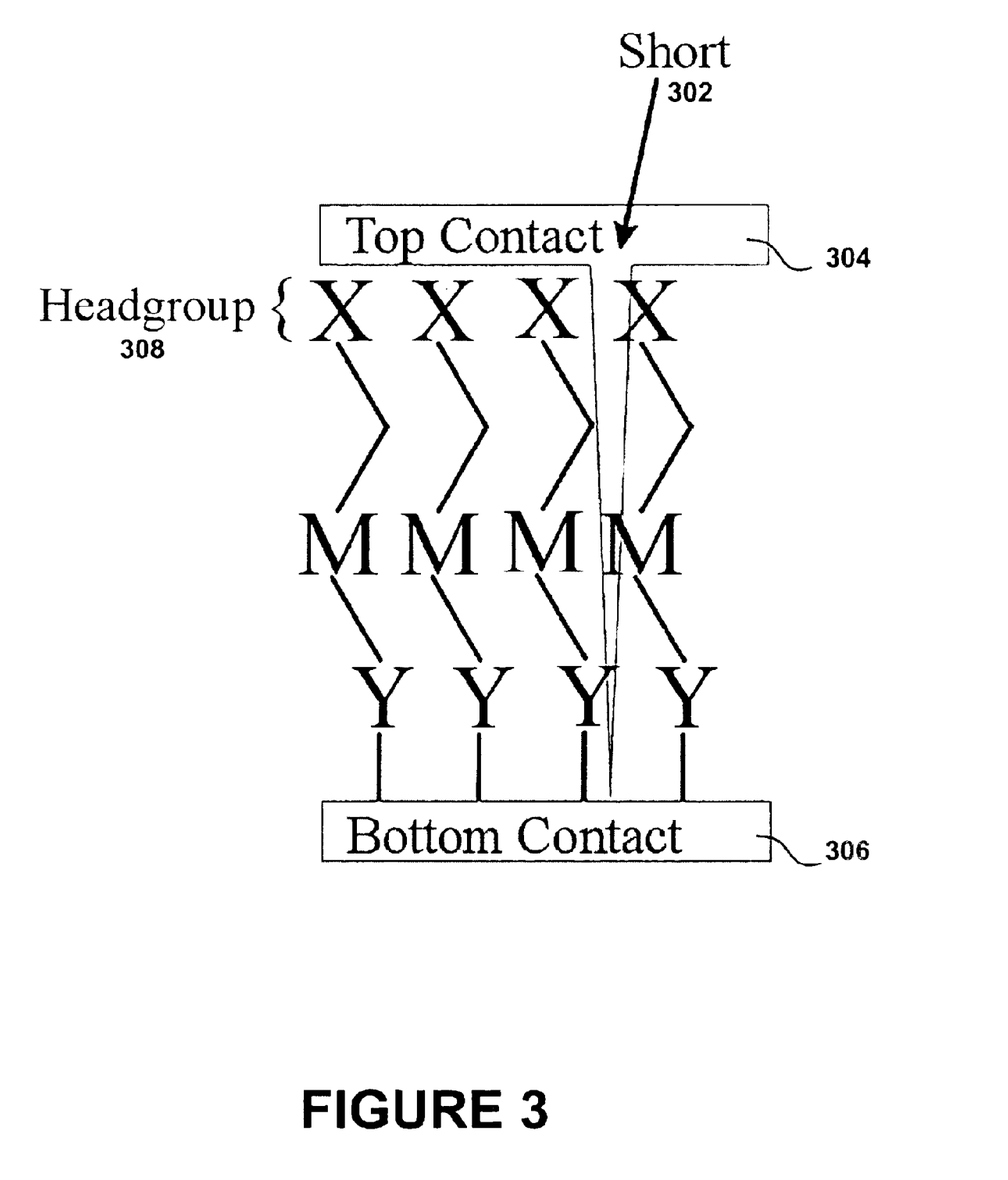
FIG. 3 is a schematic illustration of the interaction of metals with surface-bound molecules showing penetration of metal through film.

FIG. 3 is a schematic illustration of the interaction of metals with surface-bound molecules showing penetration of metal through film. As shown in FIG. 3, the SAM is coated with a top contact 304 using conventional vapor deposition techniques. With this method, the interaction between the evaporated metal layer 304 and the headgroup 308 of the molecule is highly dependant on the metal and chemical composition of the MF. This example illustrates a common problem in vapor deposition manufacturing of MFs where the top contact 304 penetrates the MF to reach the bottom contact 306. This condition is caused by low interaction between the headgroup 308 and the vapor deposition metal 304. The result of this low interaction is likelihood of a direct electrical connection or short 302 between the two contacts. Thus, electron flow through the MF is terminated and the device is rendered inoperable.

Figure 4:
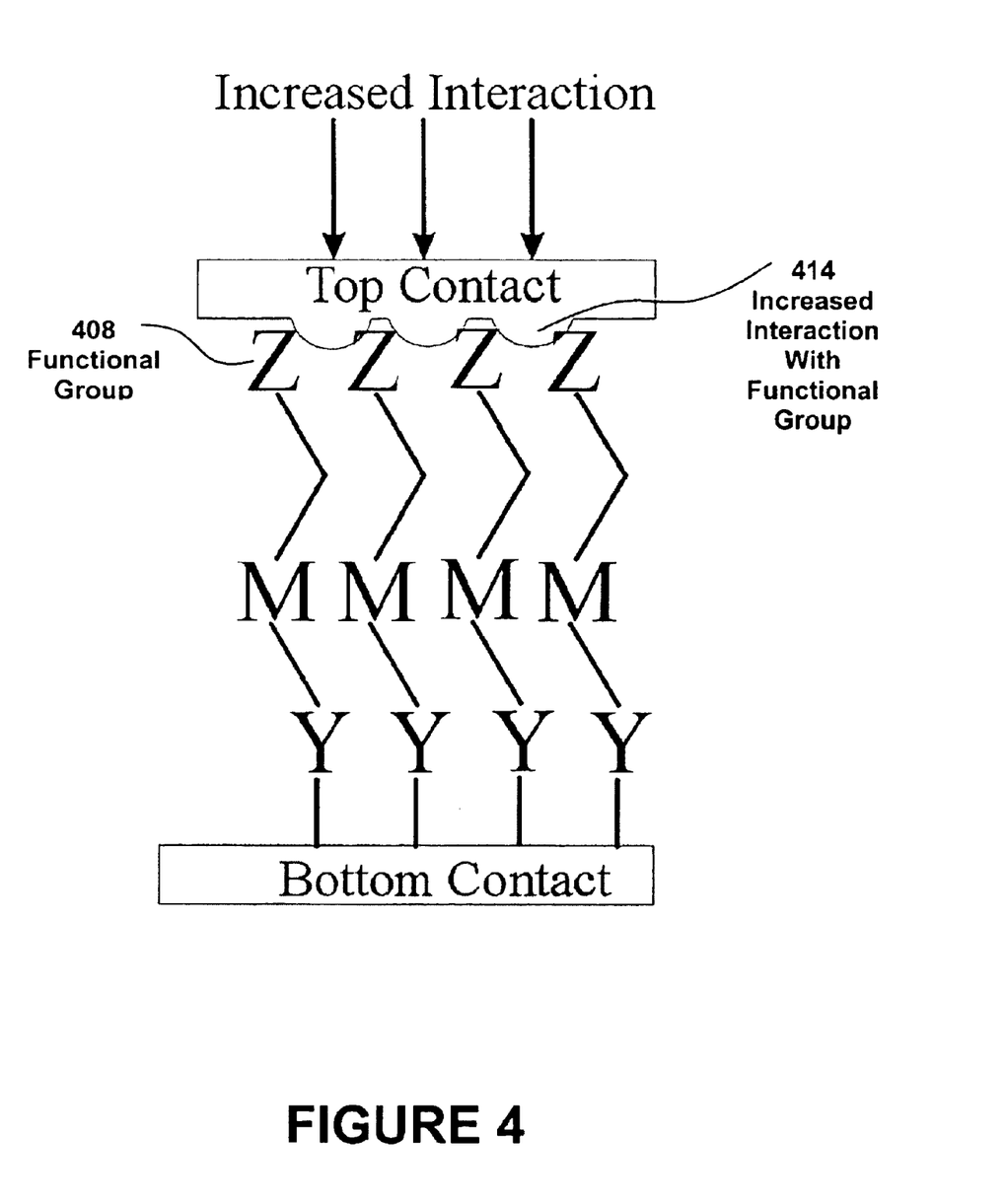
FIG. 4 is a schematic illustration of metals with surface-bound molecules showing increased interaction of top metal with headgroup.

FIG. 4 is a schematic illustration of metals with surface-bound molecules showing increased interaction 414 of the deposited metal with a functional group 408 when utilizing ELD. As shown in FIG. 3, the interaction between the metal and a MF may be changed through the introduction of a functional group (Z) 408 to the molecular structure. The increased interaction 414 between the metal contact and the MF results in increased interaction between the functional group of the SAM and the metal. This allows metal to be selectively patterned over areas where the SAM is receptively patterned and limits direct electrical connections between the two contacts.

Figure 5A:
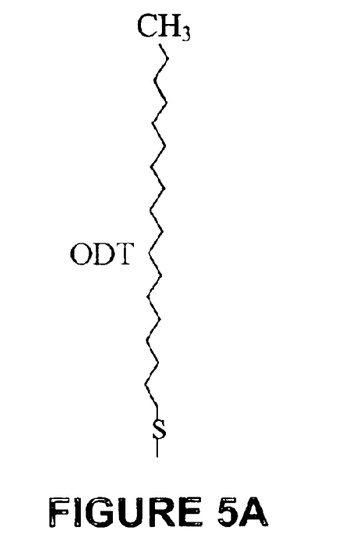
FIG. 5A is a schematic illustration of self-assembled monolayers of octadecanethiol (ODT)

FIG. 5A is a schematic illustration of a SAM of octadecanethiol (ODT). With reference to FIG. 5A, ODT has a methyl (—$CH_3$) functional group that is chemically inert and severely limits the degree of interaction between the functional group and deposited metal. Thus, ODT can be used to limit or mask the deposition of metals used in the ELD process.

Figure 5B:
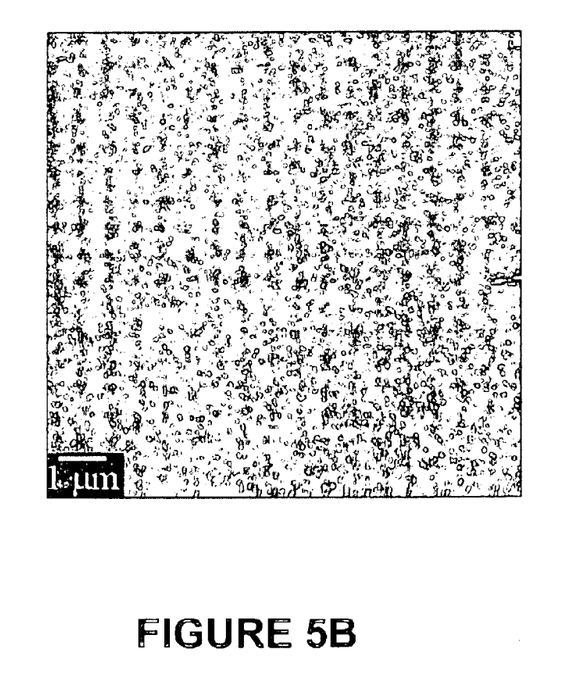
FIG. 5B is a contact AFM image of self-assembled monolayers of octadecanethiol (ODT) on gold after exposure to a copper-plating bath for 30 min.

FIG. 5B is a contact atomic force microscopy (AFM) image of the octadecanethiol SAM surfaces (as detailed in FIG. 5A) after exposure to a copper ELD plating bath. This AFM image highlights the functional group specificity of ELD. As seen in the image of FIG. 5B, no metal deposition was observed on the octadecanethiol (ODT) SAM surfaces. As previously described in FIG. 5A, the ODT has a methyl (—$CH_3$) functional group that limits the degree of interaction between the functional group and deposited metal. Thus, metal deposition is not observed on this surface in the AFM of FIG. 5B, and therefore, demonstrates the significant role of the headgroup in ELD selectivity.

Figure 6A:
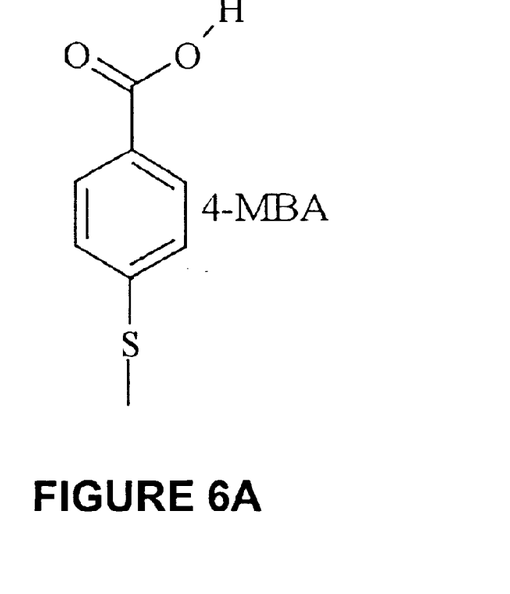
FIG. 6A is a schematic illustration of self-assembled monolayers of 4-mercaptobenzoic acid (4-MBA)

FIG. 6A is a schematic illustration of self-assembled monolayers of 4-mercaptobenzoic acid (4-MBA). The 4-MBA molecule was chosen for this application because it is a model of molecules used in current molecular electronic devices, and contains a carboxylic acid (—COOH) functional group that is readily deprotonated in basic solutions, such as ELD plating baths. The carboxylic acid functional group on 4-MBA coordinates with copper ions in the ELD solution. This facilitates the deposition of copper onto the 4-MBA surface. The specificity of this coordination only where 4-MBA is patterned on the gold surface, allows the formation of metallic contacts with increased interaction compared to evaporated metal films, and selectively deposits metal contacts only over patterned 4-MBA regions.

Figure 6B:
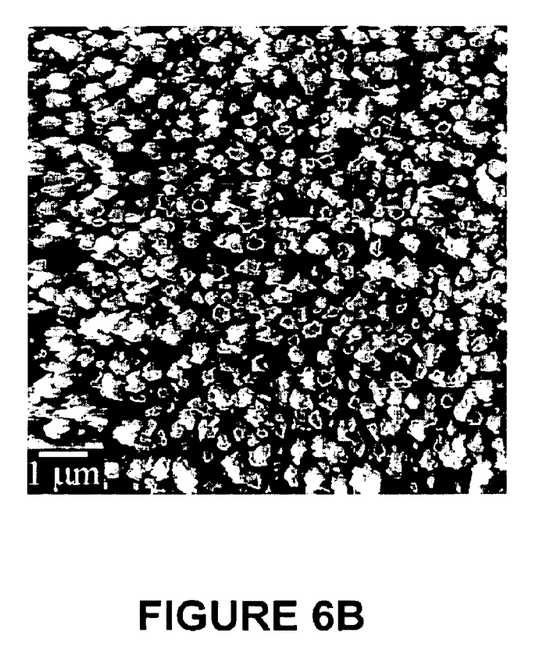
FIG. 6B is a contact AFM image of self-assembled monolayers of 4-mercaptobenzoic acid (4-MBA) on gold after exposure to a copper-plating bath for 30 min.

FIG. 6B is a contact AFM image of self-assembled monolayers of 4-mercaptobenzoic acid (4-MBA) on gold after exposure to a copper-plating bath for 30 min. Whereas metal deposition is not observed on the ODT SAM surface (FIG. 5B), copper deposits of near uniform surface coverage are observed on 4-mercaptobenzoic acid (4-MBA) SAM surfaces, as shown in FIG. 6B. These patterned metal deposits may be used as top contacts in molecular electronic devices.

Figure 7:
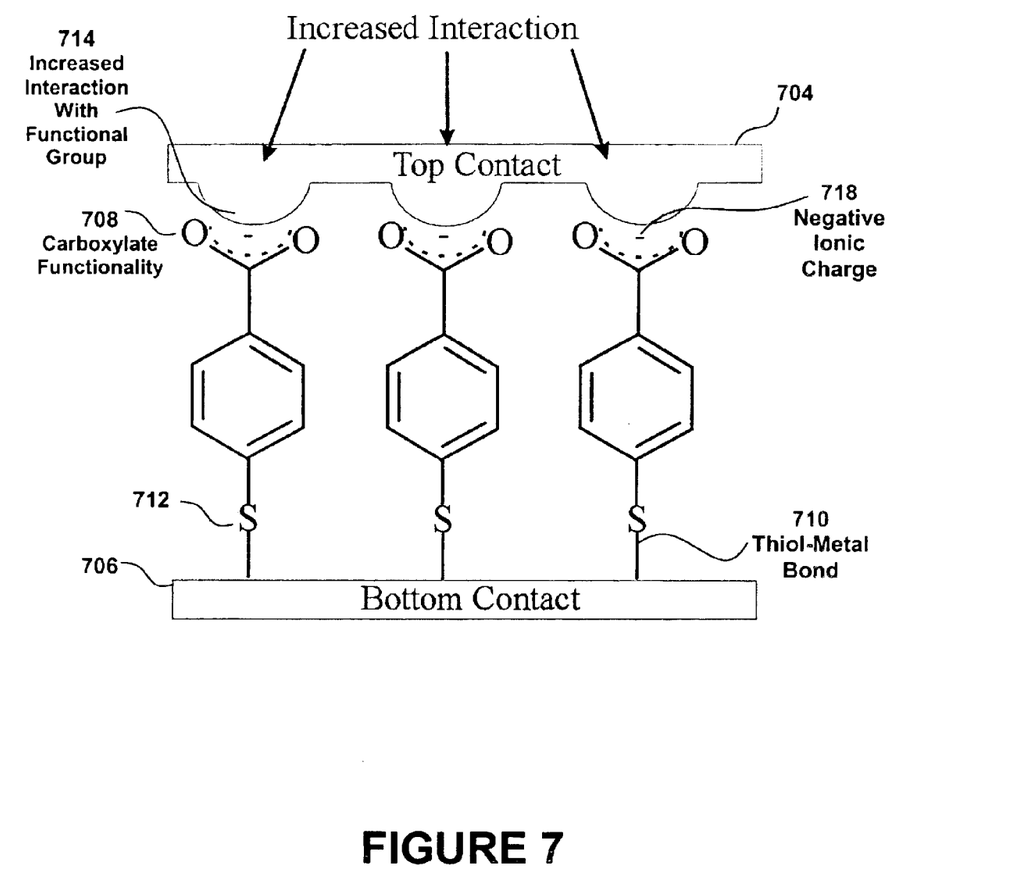
FIG. 7 is a schematic illustration of an electrolessly deposited metal with the surface of 4-MBA.

FIG. 7 is a schematic illustration of an electrolessly deposited metal with the 4-MBA surface. In this specific implementation, the SAM constituted the molecular film described above consisting of a layer of 4-MBA bound by sulfur atoms 712 with a thiol-metal bond 710 on a bottom contact 706 consisting of a gold surface. The SAM was subsequently exposed to an ELD plating bath consisting of water, formaldehyde, copper sulfate, sodium hydrogen tartrate, and adjust to a pH of 12.8 to produce the metal deposition. In this instance, the functional group of 4-MBA coordinates with $Cu^{2+}$ in solution and initiate surface ELD. The interaction between the $Cu^{2+}$ in the ELD solution is increased with the carboxylate functionality of the headgroup 708 found in the 4MBA. These oxygen groups in the carboxylic acid contain a negative charge 718 that is electrostatically attracted to the $Cu^{2+}$ in solution and thereby enhances the binding interaction 714 of the top contact 704 to the SAM. Metal is only deposited over regions where the SAM was patterned on the metallic surface.

Metal/functional group coordination increases the interaction of the deposited metal through the formation of a metal-oxide bond between the top metal contact and the functional group. This interaction is responsible for the specificity of copper deposition that occurs. The interaction between the functional group and metal ions in solution is highly dependent upon the position of the functional group on the molecule. Thus, the placement of organic functionality on molecular electronic molecules may initiate or inhibit metal ELD in these systems. Thus, metallic contacts are able to be controlled spatially through selective surface patterning.

The present embodiment allows one to spatially control the top electrode ELD as a function of functional group modification. Using this scheme, molecular electronic molecules can be patterned on a surface and top contacts formed selectively over the patterned area. To demonstrate this selectivity, patterned SAMs were achieved using microcontact printing (micro-CP) employed by placing a surface in contact with a PDMS stamp coated with 4-MBA as shown in FIG. 1. This procedure, analogous to ink stamping where in this instance a SAM is patterned on the surface at regions with high relief. Thus, desired molecules (in this case, 4-MBA) can be selectively adsorbed on a surface in a spatially confined, controlled, and reproducible manner.

Figure 8:
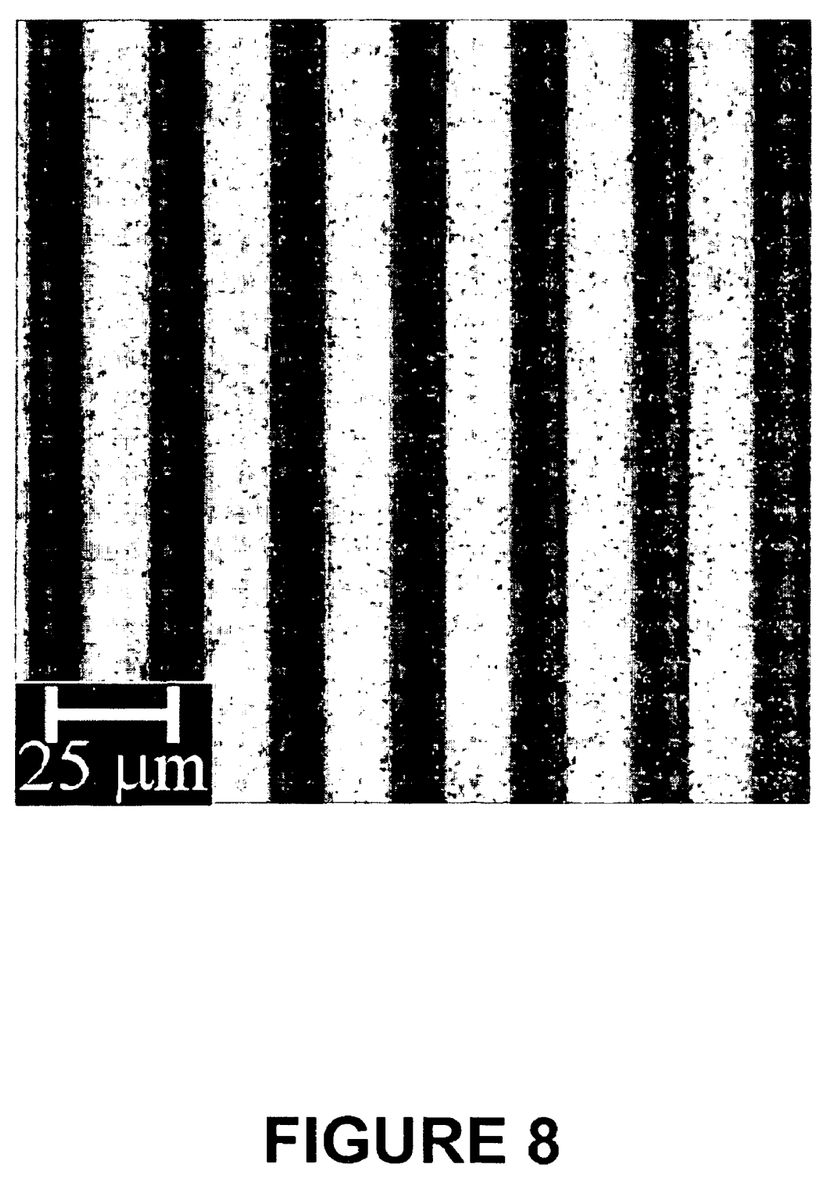
FIG. 8 is an optical image of microcontacts printed 4-MBA on gold with subsequent exposure to copper plating solution.
Figure 9:
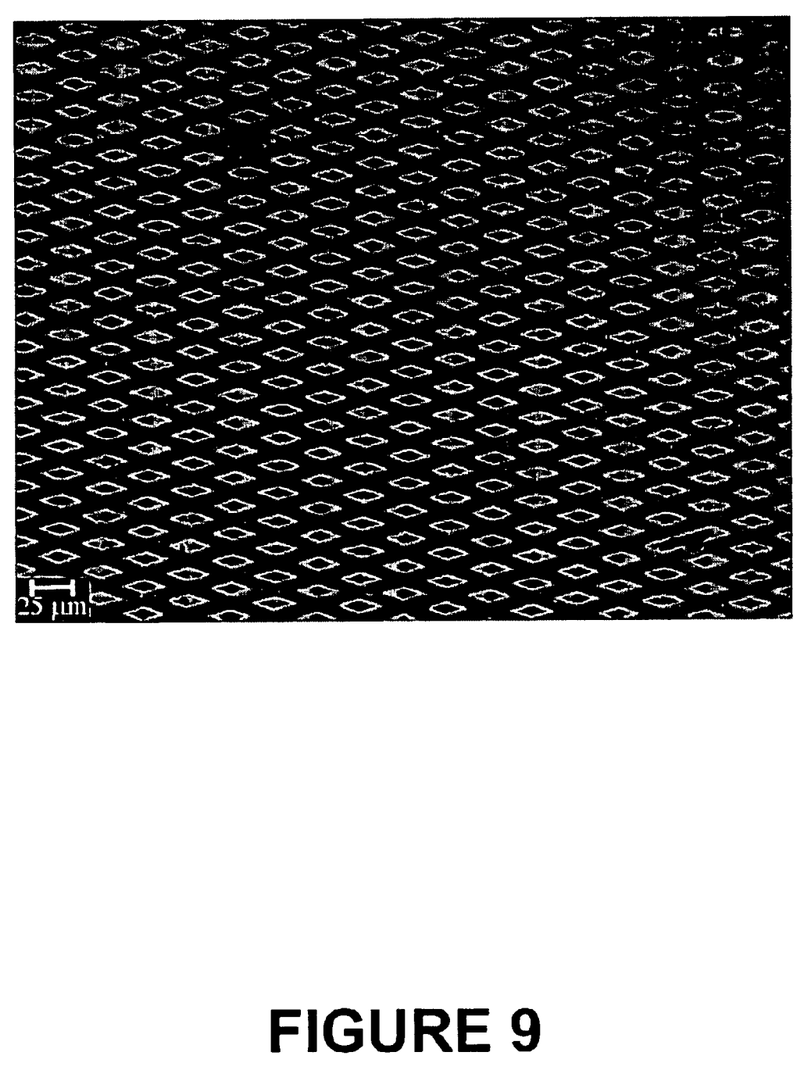
FIG. 9 is an optical image of microcontacts printed 4-MBA on gold with subsequent exposure to copper plating solution.

Two examples of the spatial selectivity achieved through micro-CP and headgroup modification are shown in FIG. 8 and FIG. 9. FIG. 8 is an optical image of microcontacts printed 4-MBA on gold. This consists of an array of 4-MBA vertical stripes on gold exposed to a copper-plating bath. In a manner similarly demonstrated in FIG. 1, copper deposition occurs on 4-MBA regions (shown as dark vertical lines) and is inhibited in regions that are devoid of 4-MBA (shown as light vertical lines.) FIG. 8 illustrates the spatial control of ELD that is achieved through functional group modification.

FIG. 9 is an optical image of microcontacts printed 4-MBA on gold with subsequent exposure to copper plating solution. In this example, spatial control of metal deposition achieved through functional group modification is shown by the more complex micro-CP pattern. In this example, copper deposition occurs on 4-MBA regions (shown as dark diagonal lines) and is inhibited in regions that are devoid of 4-MBA (shown as light diamond shapes.) Spatial control of metal deposition is limited by the ability to pattern SAM films and the grain size of the metal deposited. The grain size of metal deposits can be controlled by varying the solution conditions of the ELD plating bath. Thus, using current micro-CP technology and ELD, FIG. 9 illustrates that metal deposition can be controlled on a nanometer spatial scale.

These examples illustrate the specificity of organic functional group modification in the spatial confinement of ELD. These embodiments effectively allow arrays of molecular electronic compounds to be isolated on a surface and provide attachment of a top contact to surface confined molecules. Molecular electronic devices may be built using this scheme.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A solid state device made by the process comprising:

depositing a self-assembled monolayer on a metal substrate, said self-assembled monolayer having a functional group that provides increased interaction with metal ions in an electroless plating bath, said self-assembled monolayer being selectively deposited on predetermined areas of said metal substrate;

placing said self-assembled monolayer, that is deposited on said metal substrate, together with said functional group, in an electroless plating bath so that metal ions in solution in said electroless plating bath are reduced on said self-assembled monolayer through interaction with said functional group to form a metallic contact layer such that said metallic contact layer does not penetrate said self-assembled monolayer and does not form a short circuit to said metal substrate wherein said self-assembled monolayer comprises 4-mercaptobenzoic acid.

2. A solid state device comprising:

a metal substrate;

a self-assembled monolayer that is bound to said metal substrate and that is selectively deposited on said metal substrate in predetermined areas;

a functional group that forms a portion of said self-assembled monolayer, that provides increased interaction with metal ions in an electroless plating bath;

a metal contact layer that is reduced on said self-assembled monolayer through interaction with said functional group in said electroless bath such that said metal contact layer does not penetrate said self-assembled monolayer and does not form a short circuit to said metal substrate wherein said self-assembled monolayer is 4-mercaptobenzoic acid.

* * * * *